(12) United States Patent
Hillenbrand et al.

(10) Patent No.: US 10,018,678 B2
(45) Date of Patent: Jul. 10, 2018

(54) METHOD AND DEVICE FOR MEASURING A BATTERY CELL CURRENT

(71) Applicant: Robert Bosch GmbH, Stuttgart (DE)

(72) Inventors: Philipp Hillenbrand, Neuffen (DE); Bernhard Springer, Denkingen (DE)

(73) Assignee: Robert Bosch GmbH, Stuttgart (DE)

( * ) Notice: Subject to any disclaimer, the term of this patent is extended or adjusted under 35 U.S.C. 154(b) by 103 days.

(21) Appl. No.: 15/116,538

(22) PCT Filed: Jan. 30, 2015

(86) PCT No.: PCT/EP2015/051897
§ 371 (c)(1),
(2) Date: Aug. 4, 2016

(87) PCT Pub. No.: WO2015/121085
PCT Pub. Date: Aug. 20, 2015

(65) Prior Publication Data
US 2016/0377683 A1  Dec. 29, 2016

(30) Foreign Application Priority Data
Feb. 13, 2014 (DE) .................... 10 2014 202 617

(51) Int. Cl.
*H02J 7/00* (2006.01)
*G01R 31/36* (2006.01)
(Continued)

(52) U.S. Cl.
CPC ..... *G01R 31/3627* (2013.01); *G01R 31/3606* (2013.01); *G01R 31/3658* (2013.01);
(Continued)

(58) Field of Classification Search
CPC .............. G01R 31/362; G01R 31/3679; G01R 31/3658; G01R 31/3662; G01R 31/3606;
(Continued)

(56) References Cited

U.S. PATENT DOCUMENTS 4,413,234 A * 11/1983 Lupoli ............. G01R 19/16542
320/DIG. 21
4,564,798 A *  1/1986 Young ................. B60L 11/1861
320/103
(Continued)

FOREIGN PATENT DOCUMENTS

DE    102011113798    5/2012
DE    102012203309    9/2013
(Continued)

OTHER PUBLICATIONS

International Search Report for Application No. PCT/EP2015/051897 dated May 15, 2015 (English Translation, 2 pages).

*Primary Examiner* — Jermele M Hollington
*Assistant Examiner* — Taqi Nasir
(74) *Attorney, Agent, or Firm* — Michael Best & Friedrich LLP

(57) ABSTRACT

The invention relates to a method and to a device for measuring a battery cell current through a battery cell unit. After the battery cell unit has been switched off, inductively stored energy from the battery cell unit is discharged (S1) by means of a discharging unit, wherein the inductively stored energy from the battery cell unit is energy stored by means of an inductive behavior of the battery cell unit, a time period in which the inductively stored energy from the battery cell unit has fallen to a predefined threshold value is determined (S2), and a battery cell current is determined (S3) on the basis of the time period determined.

10 Claims, 6 Drawing Sheets

(51) Int. Cl.
   *H01M 10/48* (2006.01)
   *H01M 10/44* (2006.01)
(52) U.S. Cl.
   CPC ............ *H01M 10/44* (2013.01); *H01M 10/48* (2013.01); *H02J 7/0021* (2013.01); *H02J 7/0047* (2013.01); *G01R 31/3679* (2013.01)
(58) Field of Classification Search
   CPC .......... G01R 31/3651; H01M 2220/20; H01M 10/0525; H01M 2/345; H01M 2200/20; H01M 2/348; H01M 10/052; H01M 10/425; H02J 7/007; H02J 2007/0067; H02J 7/0063; H02J 7/0016
   USPC ..... 324/416, 72.5, 131, 29.5, 425–437, 141, 324/142, 207.15, 654, 76.75, 382, 409, 324/678; 429/158, 210, 10, 105, 447, 429/204, 53, 61, 64; 320/122, 118, 136, 320/426, 120, 160
   See application file for complete search history.

(56) References Cited

U.S. PATENT DOCUMENTS

| | | | | |
|---|---|---|---|---|
| 5,093,624 | A * | 3/1992 | Stevenson | H02J 7/0077 324/426 |
| 5,537,042 | A * | 7/1996 | Beutler | G01R 27/02 324/234 |
| 5,894,212 | A * | 4/1999 | Balogh | H02J 7/0026 320/116 |
| 8,183,870 | B1 * | 5/2012 | Davies | H01M 10/4207 320/118 |
| 2003/0206021 | A1 * | 11/2003 | Laletin | G01R 31/3631 324/426 |
| 2005/0275382 | A1 | 12/2005 | Stessman et al. | |
| 2012/0105078 | A1 | 5/2012 | Kikuchi et al. | |

FOREIGN PATENT DOCUMENTS

| | | |
|---|---|---|
| DE | 102012206622 | 10/2013 |
| DE | 102012209660 | 12/2013 |

* cited by examiner

METHOD AND DEVICE FOR MEASURING A BATTERY CELL CURRENT

BACKGROUND OF THE INVENTION

The present invention relates to a method and to a device for measuring a battery cell current.

Current battery systems are constructed from a plurality of battery cell control units comprising respectively one battery cell, whereby an individual control of the individual battery cells connected to the battery cell control unit is made possible. The battery cells are connected to one another in a series circuit via the battery cell control units. Furthermore, a central control unit for controlling the battery system is present.

In order to generate a controlled total output voltage of the battery system, individual battery cells are inserted with the aid of the battery cell control units into the series circuit either with positive or negative polarity, relative to the tap of the total output voltage, (condition: "connected with positive polarity" or "connected with negative polarity"); or said individual battery cells are switched off, i.e. are separated from the series circuit and the connection terminals of the associated battery cell control unit are connected in an electrically conductive manner (condition: "bypassed").

In addition, the battery system is controlled in such a manner that battery cells are activated as a function of the state of charge thereof and of further state variables (e.g. SOH—state of health), whereby an active balancing of the battery cells is made possible.

The SOH can be determined on the basis of the current cell voltage and the energy already withdrawn, which is possible with the aid of a current sensor. Because each battery cell can be actuated independently of the other battery cells in such a battery system, each battery cell requires an option for determining the charging/discharging current with which said cell is currently being charged/discharged. The current measurement can, e.g., be carried out on each of the battery cell control units by means of a shunt resistor measurement or a Hall sensor.

A battery system or respectively a battery 60 according to the prior art is shown in FIG. 6. The battery system 60 comprises a plurality of battery cell control units 61 connected in series (also referred to as smart cell units). Each battery cell control unit 61 comprises a battery cell 64. The battery cell control units 61 are connected to a central controller 63 via a unidirectional communication interface 62. The battery cells 64 of the battery cell control units 61 can be individually inserted into a series circuit of all the battery cells 54 or bypassed in said series circuit by means of a control signal from the central controller 63 via the unidirectional communication interface 62.

SUMMARY OF THE INVENTION

The method according to the invention for measuring a battery cell current through a battery cell unit comprises the steps: discharging an inductively stored energy from the battery cell unit by means of a discharging unit after the battery cell unit has been switched off, wherein the inductively stored energy from the battery cell unit is energy stored by means of an inductive behavior of the battery cell unit, determining a time period in which the inductively stored energy from the battery cell has fallen to a predefined threshold value, and determining a battery cell current on the basis of the time period determined.

The device according to the invention for measuring a battery cell current through a battery cell unit comprises a discharging unit, which discharges an inductively stored energy from the battery cell unit after the battery cell unit has been switched off, wherein the inductively stored energy from the battery cell unit is energy stored by means of an inductive behavior of the battery cell unit, a measuring unit, which determines a time period in which the inductively stored energy from the battery cell unit has fallen to a predefined threshold value, and an evaluation unit which determines a battery cell current on the basis of the determined time period.

In this way, a cost effective option for determining a current which has flowed through a battery cell unit immediately prior to being switched off is provided. Furthermore, voltage peaks are prevented upon switching on the battery cell, said voltage peaks being caused by the inductive behavior of the battery cell unit. Because the battery current is present when the battery cell has been switched off, external interferences on the measurement are furthermore kept to a minimum. In particular, power electronic components of a conventional battery cell control unit that are already present can be used. In addition, an additional resistor in the power path is not required, whereby power losses are kept to a minimum. A cost effective alternative particularly with respect to a measurement using a Hall sensor is created.

It is advantageous if the battery cell unit is switched off by the discharging unit. By means of such a multiple use of the discharging unit, the number of necessary components of a battery cell control unit can be reduced, whereby a cost advantage arises.

It is furthermore advantageous if the inductively stored energy from the battery cell unit is detected by means of a measurement voltage induced by the battery cell unit after being switched off. This facilitates a measurement of the inductively stored energy from the battery cell unit with little cost and effort. In many batteries, means are, in particular, already provided for measuring a measurement voltage, whereby additional means for detecting the stored energy of the battery cell unit are not required and thus a cost advantage ensues.

It is likewise advantageous if the stored energy of the battery cell unit is discharged and/or the battery cell is switched off via a transistor, in particular a MOSFET, of the discharging unit. As a result of the fast switching times of a transistor, a particularly precise measurement can thus take place. In addition, other inductively caused voltage peaks are largely prevented, as they would occur with other switches. A MOSFET is particularly advantageous because such a transistor is optimized for conducting and blocking large electrical currents and voltages which occur in a series circuit of a plurality of battery cells.

The inductively stored energy from the battery cell unit is advantageously discharged via a parasitic diode of a MOSFET, which goes into breakdown due to a voltage caused by the inductively stored energy from the battery cell unit. Hence, the number of required components can also be further reduced, which leads to a higher degree of reliability and lower costs. It is furthermore ensured in a simple manner that the discharging unit is only active during a discharging phase.

The inductively stored energy from the battery cell unit is particularly used for switching the transistor in order to discharge the inductively stored energy from the battery cell unit via the switched transistor. An additional switching voltage and means for providing this additional switching voltage can therefore be eliminated.

It is furthermore advantageous if the discharging of the inductively stored energy from the battery cell unit is triggered by means of a diode, in particular by means of a Zener diode, which goes into breakdown due to a voltage caused by the inductively stored energy from the battery cell unit and thus provides a voltage for switching the transistor. It is thus ensured in a simple manner that the discharging unit is only active during a discharging phase.

A battery cell control unit is furthermore advantageous which comprises the device for measuring the battery cell current and the battery cell unit. This is advantageous because a cost effective battery cell control unit having the previously mentioned advantages is thus created and can be used in current battery systems.

A battery is likewise advantageous which comprises at least one battery cell control unit according to the invention. A cost effective battery having the previously mentioned advantages is thus provided.

BRIEF DESCRIPTION OF THE DRAWINGS

Exemplary embodiments of the invention are described below in detail with reference to the accompanying drawings. In the drawings.

DETAILED DESCRIPTION

Figure 1:
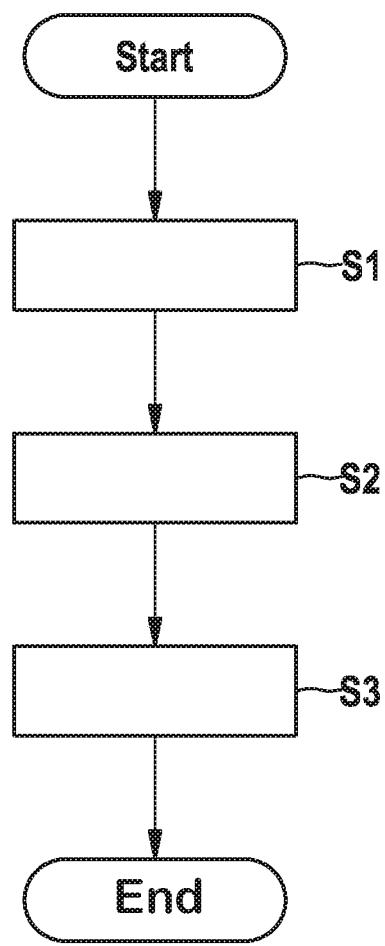
FIG. 1 shows a flow diagram of a preferred inventive method for measuring a battery cell current.

FIG. 1 shows a flow diagram of a preferred inventive method for measuring a battery cell current $I_B$. The method comprises a first step S1, a second step S2 and a third step S3. The method is advantageously initiated by a signal for switching off a battery cell unit 20, through which the battery cell current $I_B$ to be measured flows. Such a signal can, for example, be emitted by a central controller. If the method has been initiated, the first step S1 is initially carried out, then the second step S2 and finally the third step S3. After carrying out the third step S3, the method is concluded.

In the first step S1, an inductively stored energy from the battery cell unit 20 is discharged by means of a discharging unit 10 after switching of the battery cell unit 20. In this case, the inductively stored energy from the battery cell unit 20 is energy stored by means of an inductive behavior of the battery cell unit 20. A battery cell unit 20 is a unit which comprises at least one battery cell 23. The battery cells 23 of a battery cell unit 20 can be connected in series and/or in parallel with one another. Each of the battery cells 23 exhibits an inductive behavior if the battery cell 23 is switched off. Switched off refers to the battery 23 being separated from a load. The inductive behavior of the battery cell 23 can, for example, be contingent upon the physical construction of the battery cell 23. A coil-like behavior of the battery cell 23 can, for example, be caused by a winding of the electrodes of the battery cell 23. The inductive behavior of the battery cell unit 20 is established by the inductive behavior of the individual battery cells 23. Energy is therefore stored by the battery cell unit 20 like a coil. The energy of the battery cell unit 20 inductively stored by means of the inductive behavior of the battery cell unit 20 is therefore energy which is additionally, besides the electrochemically stored energy of the battery cell unit 20, stored temporarily in the battery cell unit 20. According to the invention, the inductively stored energy from the battery cell unit 20 is entirely or partially discharged by a discharging unit 10 after the battery cell unit 20 has been switched off. To this end, an electrically conductive connection of a connecting pole 21, 22 of the battery cell unit is established to a ground point, or a connection of a connecting pole 21, 22 of the battery cell unit to a point is established, the electric potential of which is lower than that of the battery cell unit 20 after said battery cell unit has been switched off. This electrically conductive connection preferably comprises a resistor, by means of which a speed of the discharge can be influenced. This electrically conductive connection is preferably disconnected as soon as the inductively stored energy from the battery cell unit 20 is discharged in order to prevent a discharge of the electrochemically stored energy of the battery cell unit 20 via the discharging unit.

In the second step S2, a time period $t_M$ in which the inductively stored energy from the battery cell unit 20 falls to a predefined threshold value is determined. In so doing, the inductively stored energy from the battery cell unit 20 can be directly measured and the measured value can be compared to a threshold value. A parameter can likewise be measured, which is influenced by the inductively stored energy from the battery cell unit 20. After the battery cell unit 20 has been switched off, a voltage could, for example, then be measured across the discharging unit 10 and/or the battery cell unit 20 and be compared to a threshold value, which in this case is a voltage value S. Similarly, a time interval between the point in time when the battery cell unit 20 was switched off and an event can also be measured as the time period $t_M$, said event occurring if the inductively stored energy from the battery cell unit 20 has reached the threshold value. Such an event could, for example, be an end of the discharging process by means of the discharging unit 10 or the switching of a transistor.

In step 3, a battery cell current $I_B$ is determined on the basis of the determined time period $t_M$. Because the initial inductively stored energy from the battery cell unit 20 is dependent on the battery cell current $I_B$ which flowed through the battery cell unit 20 before the same was switched off, the determined time period $t_M$ increases with the battery cell current $I_B$ because a larger stored energy requires a longer time period in order to be discharged. The battery cell current $I_B$ which has flowed through the battery cell unit 20 prior to said battery cell unit being switched off can thus be inferred from the determined time period $t_M$. This can, for example, take place by means of a previous calibration in which a battery cell current $I_B$ is in each case associated with different time periods $t_M$.

Figure 2:
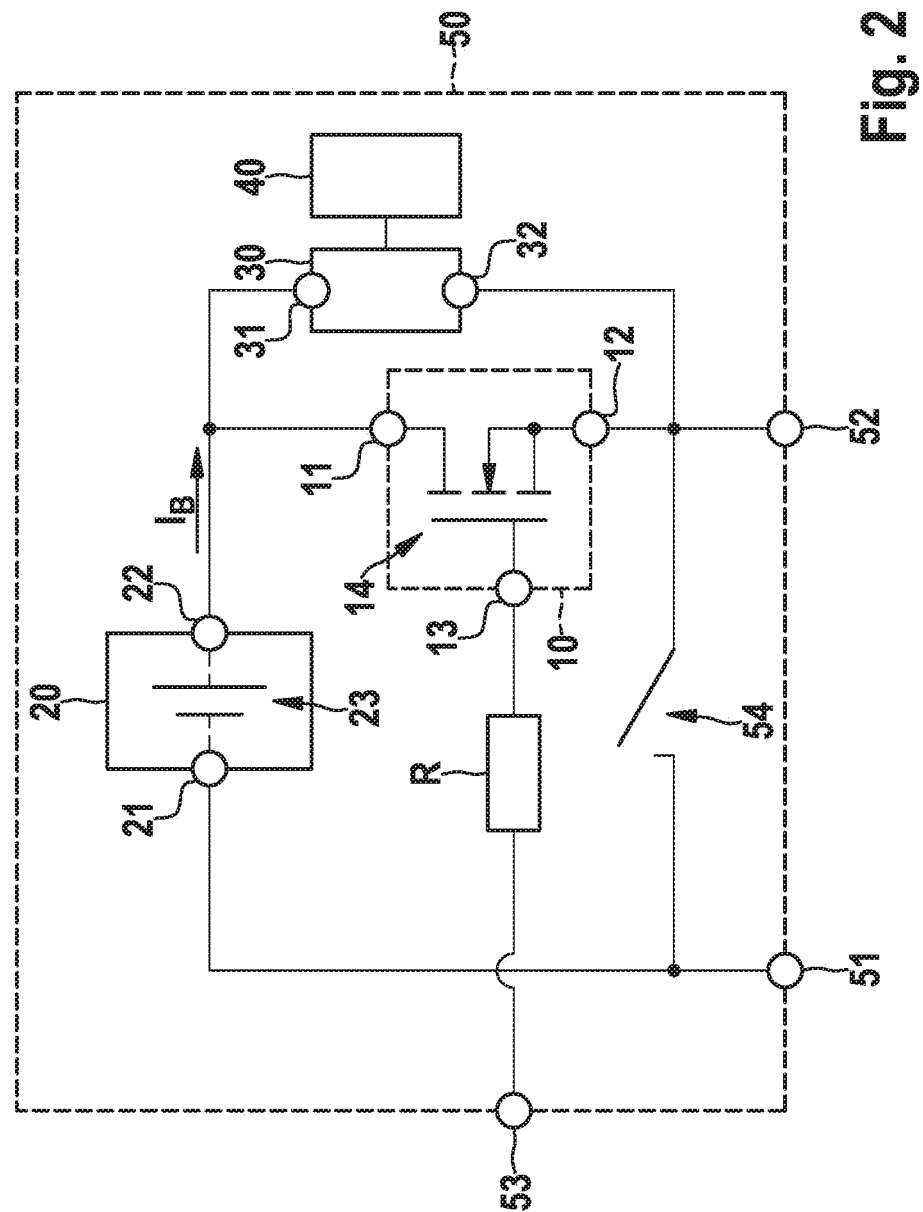
FIG. 2 shows a schematic depiction of a battery control unit comprising a device for measuring a battery cell current in a first preferred embodiment according to the invention.

FIG. 2 shows a schematic depiction of a battery cell control unit 50 comprising a device for measuring a battery cell current $I_B$ in a first preferred embodiment according to the invention. The previously described method is carried out by the battery cell control unit 50 shown in FIG. 2. The battery cell control unit 50 comprises a battery cell unit 20, a discharging unit 10, a measuring unit 30 and an evaluation unit 40.

The battery cell control unit 50 has a first terminal contact 51, a second terminal contact 52 and a control contact 53. The discharging unit 10 comprises a MOSFET 14 in this first embodiment. The battery cell unit 20 comprises a first connecting pole 21 and a second connecting pole 22. A plurality of battery cells 23 are connected in series between the first and the second connecting pole 21, 22. The measuring unit 30 comprises a first measurement input 31 and a second measurement input 32.

The MOSFET 14 has the property that an avalanche breakdown between a drain contact 11 and a source contact 12 of the MOSFET 14 occurs at a breakdown voltage S, which is greater than a no-load voltage of the battery cell unit 20. This avalanche breakdown is a breakdown of a parasitic diode between the drain contact 11 and the source contact 12 of the MOSFET 14.

The first terminal contact 51 is connected to the first connecting pole 21 in an electrically conductive manner. The second connecting pole 22 is connected to the first measurement input 31 and the drain contact 11 of the MOSFET 14 in an electrically conductive manner. The second terminal contact 52 is connected to the second measurement input 32 and the source contact 12 of the MOSFET 14 in an electrically conductive manner. A gate contact 13 of the MOSFET 14 is connected to the control input 53 via a resistor R. The evaluation unit 40 is coupled to the measuring unit 30 in such a way that at least one signal can be transmitted from the measuring unit 30 to the evaluation unit 40 which describes the time period $t_M$.

The battery cell control unit 50 further comprises another switching unit 54, which is designed in this case as a mechanical switch but can also be a transistor or another electrical switch. This switching unit 54 is connected between the first terminal contact 51 and the second terminal contact 52. In an open state, the switching unit 54 makes it possible to serially connect the battery cell unit 20 to other battery cell units of other battery cell control units and, in a closed state, to bypass the battery cell unit 20 by using a series circuit with other battery cell units.

Figure 3:
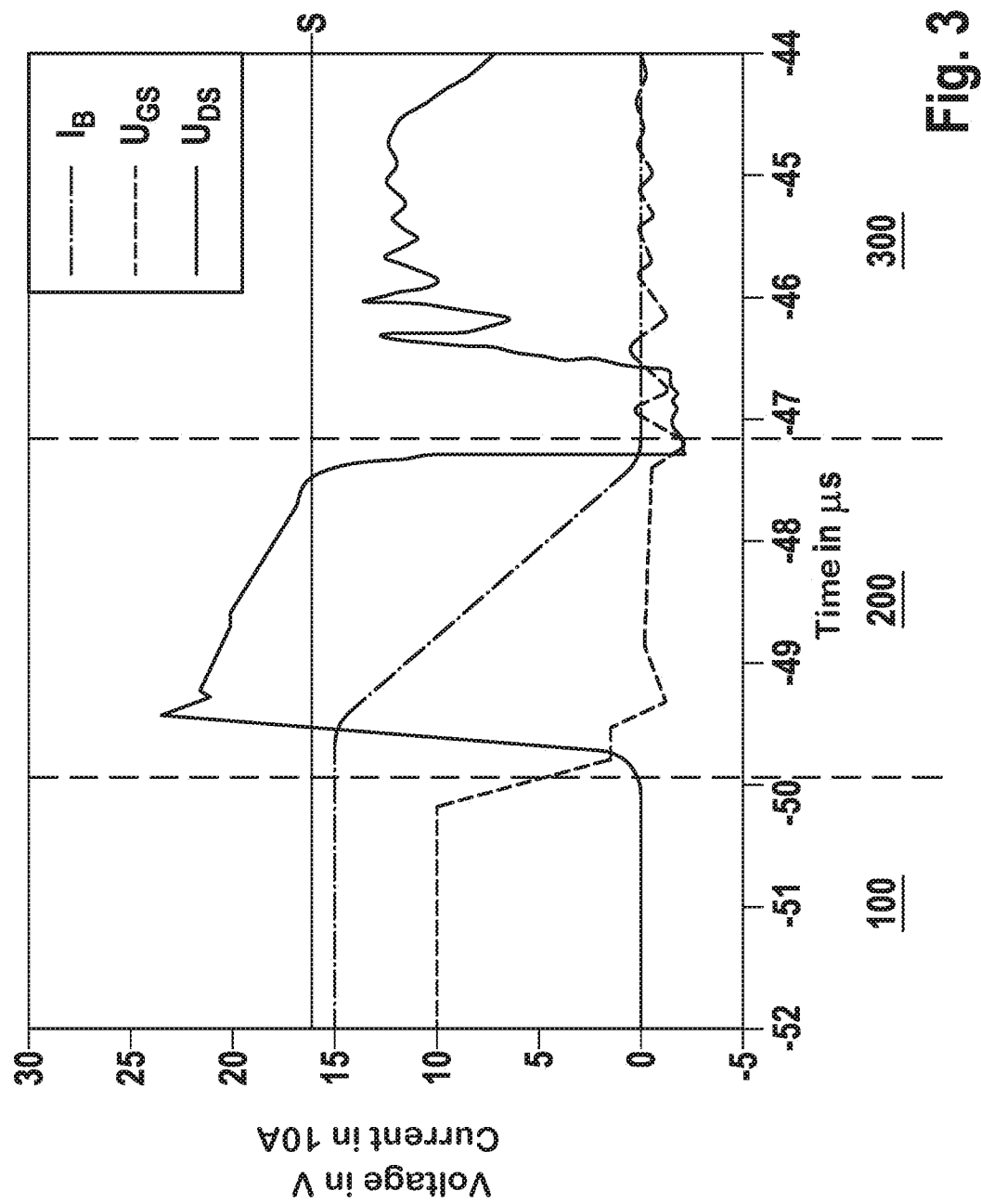
FIG. 3 shows a diagram which depicts voltages and currents at a discharging unit according to the first preferred embodiment according to the invention.

If a suitable control voltage $U_{GS}$ is applied to the control input 53, the MOSFET 14 then switches through and a current flow is thus made possible between the drain contact 11 and the source contact 12. This state is depicted in a first time period 100 in the diagram from FIG. 3. In this case, the battery cell current $I_B$ is depicted by a dot-dashed line, a measurement voltage $U_{DS}$ by a solid line and the control voltage $U_{GS}$ by a dashed line. If a load is connected to the battery cell control unit 50, a battery cell current $I_B$ can flow from the first terminal contact 51 via the battery cell unit 20 and the discharging unit 10 to the second terminal contact 52. A measurement voltage $U_{DS}$ is measured between the drain contact 11 and the source contact 12 by means of the measuring unit 30. In this first embodiment, the measurement voltage $U_{DS}$ between the drain contact 11 and the source contact 12 is "0" volts if the control voltage $U_{GS}$ is applied to the control input 53 because the resistance between the drain contact 11 and the source contact 12 of the MOSFET 14 approaches 0 Ohms in this case.

In this first preferred embodiment according to the invention, the battery cell unit 20 is switched off by the MOSFET 14 of the discharging unit 10 if the control voltage $U_{GS}$ is no longer applied to the control input 53. Simultaneously with the battery cell unit 20 being switched off, said battery cell unit is bypassed by closing the switching unit 54 in order not to interrupt a current flow through possible further battery cell units 20 that are connected in series with the battery cell unit 20. This state is depicted in the diagram from FIG. 3 in a second time period 200. The control voltage $U_{GS}$ is interrupted and drops to "0" volts. In this state, the MOSFET 14 switches off and the current flow is interrupted between the drain contact 11 and the source contact 12. As a result of the absent or at least high-impedance electrical connection between the drain contact 11 and the source contact 12, a measurement voltage $U_{DS}$ greater than "0" volts is produced. Due to the inductive behavior of the battery cell unit 20, the measurement voltage $U_{DS}$ exceeds the no-load voltage of the battery cell unit 20. Hence, the avalanche breakdown of the MOSFET 14 occurs and an electrically conductive connection is established between the drain contact 11 and the source contact 12. The energy inductively stored in the battery cell unit 20 is discharged via this electrically conductive connection and thus via the MOSFET 14 or respectively via the discharging unit 10 because the battery cell unit 20 is short circuited via the switching unit 54 and the MOSFET 14. Because the inductively stored energy from the battery cell unit 20 decreases, the measurement voltage $U_{DS}$ also decreases between the drain contact 11 and the source contact 12. If the breakdown voltage S of the MOSFET 14 is reached due to the falling measurement voltage $U_{DS}$, the MOSFET 11 then blocks the electrically conductive connection between the drain contact 11 and the source contact 12. The measurement voltage $U_{DS}$ drops to the value of a voltage of the battery cell unit (respectively to a voltage of a battery, in the event a plurality of battery cell units are connected in series). The battery cell control unit 50 thus passes into the state which is depicted by the time period 300 in FIG. 3. The inductively stored energy from the battery cell unit 20 is therefore discharged by means of the discharging unit after the battery cell unit 20 has been switched off, and the previously described first step S1 is therefore carried out.

The measurement voltage $U_{DS}$—and therefore also the increase in the measurement voltage $U_{DS}$ above the no-load voltage after the battery cell unit has been switched off and the drop in the measurement voltage $U_{DS}$ if the breakdown voltage S is again undershot—is measured by the measuring unit 30. In so doing, the measuring unit 30 is equipped to determine the time period $t_M$ between this rise and drop in the measurement voltage $U_{DS}$. This determined time period $t_M$ is transmitted as an analog or digital value to the evaluation unit 40. The time period $t_M$, in which the inductively stored energy from the battery cell unit has fallen to a predefined threshold value, is therefore determined by the measuring unit 30. In this first embodiment, the threshold value is defined by the breakdown voltage S of the MOSFET 14. The previously described second step S2 is thus carried out by the measuring unit 30.

In this first embodiment, the determined time period $t_M$ is converted into a digital value and transmitted from the measuring unit 30 to the evaluation unit 40. In the evaluation unit 40, the determined time period $t_M$ is compared to a predefined table and the determined value $t_M$ is thus converted to a value which describes the battery cell current $I_B$. Such a table can, for example, be predefined at the factory and be created in advance by means of a series of tests when simultaneously directly measuring the battery current $I_B$. An inductance of the battery cell unit 20 could likewise be determined and the battery cell current $I_B$ could be calculated from the evaluation unit 40. The evaluation unit 40 determines the battery cell current $I_B$ thus on the basis of the determined time period $t_M$. Hence, the previously described third step S3 is carried out by the evaluation unit 40.

Figure 4:
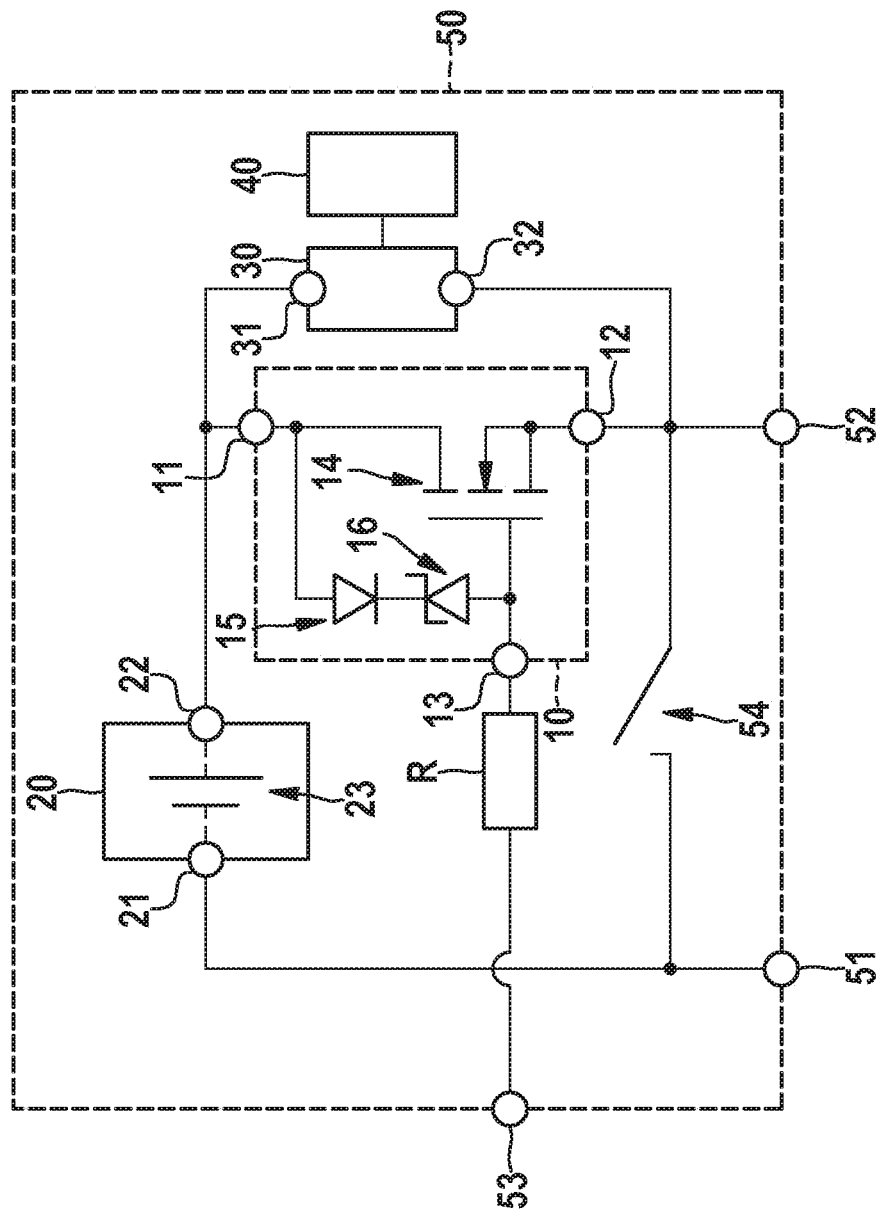
FIG. 4 shows a schematic depiction of a battery cell control unit comprising a device for measuring a battery cell current in a second preferred embodiment according to the invention.

FIG. 4 shows a schematic depiction of a battery cell control unit comprising a device for measuring a battery cell current in a second preferred embodiment according to the invention. The previously described method is carried out by means of the battery cell control unit 50 shown in FIG. 4. The battery cell control unit 50 comprises a battery cell unit 20, a discharging unit 10, a measuring unit 30 and an evaluation unit 40.

The battery cell control unit 50 has a first terminal contact 51, a second terminal contact 52 and a control contact 53. In this second embodiment, the discharging unit 10 comprises a MOSFET 14, a diode 15 and a Zener diode 16. The battery cell unit 20 comprises a first connecting pole 21 and a second connecting pole 22. A plurality of battery cells 23 is connected in series between the first and the second connecting pole 21, 22. The measuring unit comprises a first measurement input 31 and a second measurement input 32.

The Zener diode 16 has the property that a breakdown occurs at a Zener voltage S which is greater than a no-load voltage of the battery cell unit 20.

The first terminal contact 51 is connected to the first connecting pole 21 in an electrically conductive manner. The second terminal pole 22 is connected to the first measurement input 31 and the drain contact 11 of the MOSFET 14 in an electrically conductive manner. The second terminal contact 52 is connected to the second measurement input 32 and the source contact 12 of the MOSFET 14 in an electrically conductive manner. A gate contact 13 of the MOSFET 14 is connected via a resistor R to the control input 53 in an electrically conductive manner. An anode of the diode 15 is connected to the drain contact 11 in an electrically conductive manner, and a cathode of the diode 15 is connected to a cathode of the Zener diode 16 in an electrically conductive manner. An anode of the Zener diode 16 is connected to the gate contact 13 in an electrically conductive manner. The evaluation unit 40 is coupled to the measuring unit 30 in such a way that at least one signal which describes the time period $t_M$ can be transmitted from the measuring unit 30 to the evaluation unit 40.

The battery cell control unit 50 further comprises another switching unit 54, which is designed here as a mechanical switch but can also be a transistor or another electrical switch. This switching unit 54 is connected between the first terminal contact 51 and the second terminal contact 52. In an open state, the switching unit 54 makes it possible to serially connect the battery cell unit 20 to other battery cell units of other battery cell control units and in a closed state to bypass the battery cell unit 20 by using a series circuit with other battery cell units.

Figure 5:
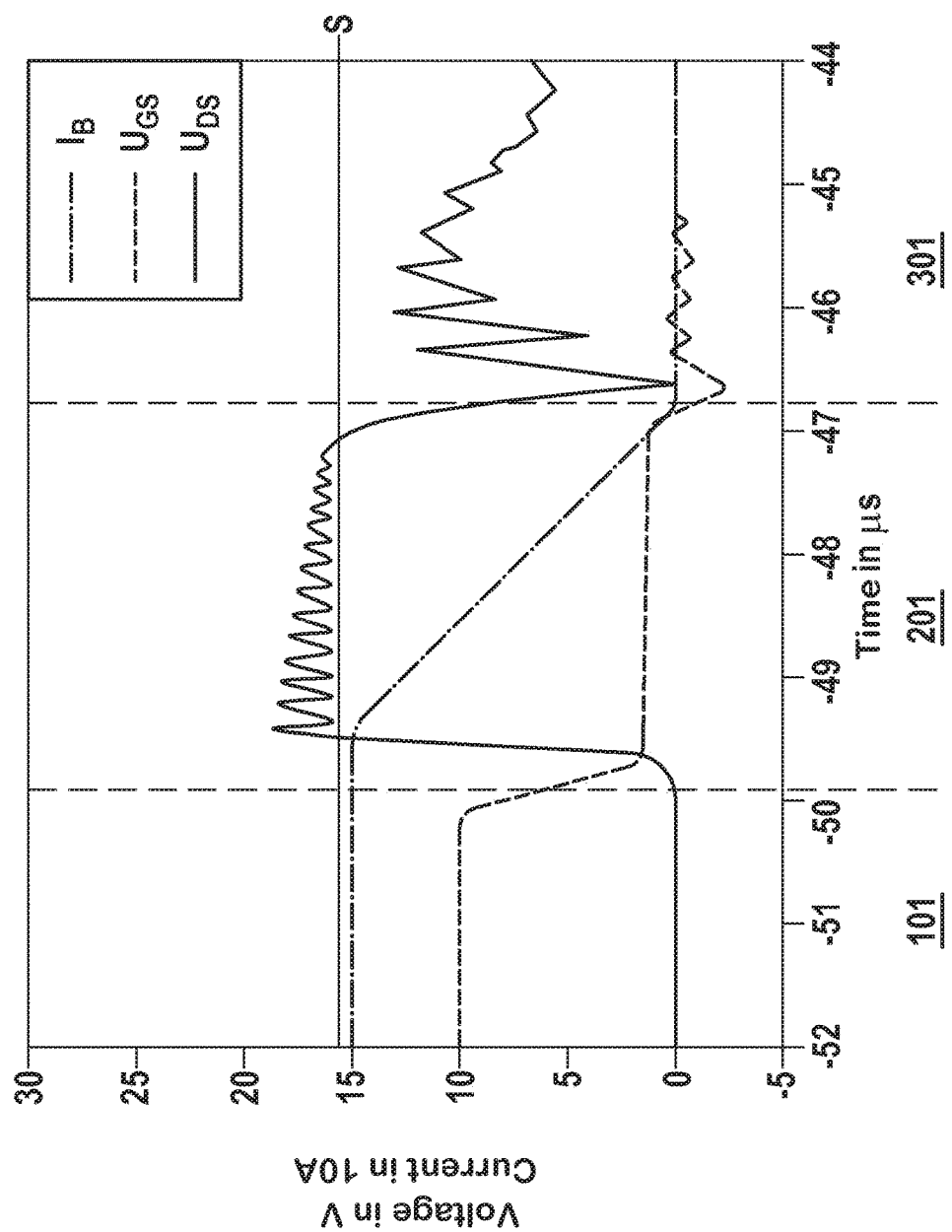
FIG. 5 shows a diagram which depicts voltages and currents at a discharging unit according to the second preferred embodiment according to the invention.
Figure 6:
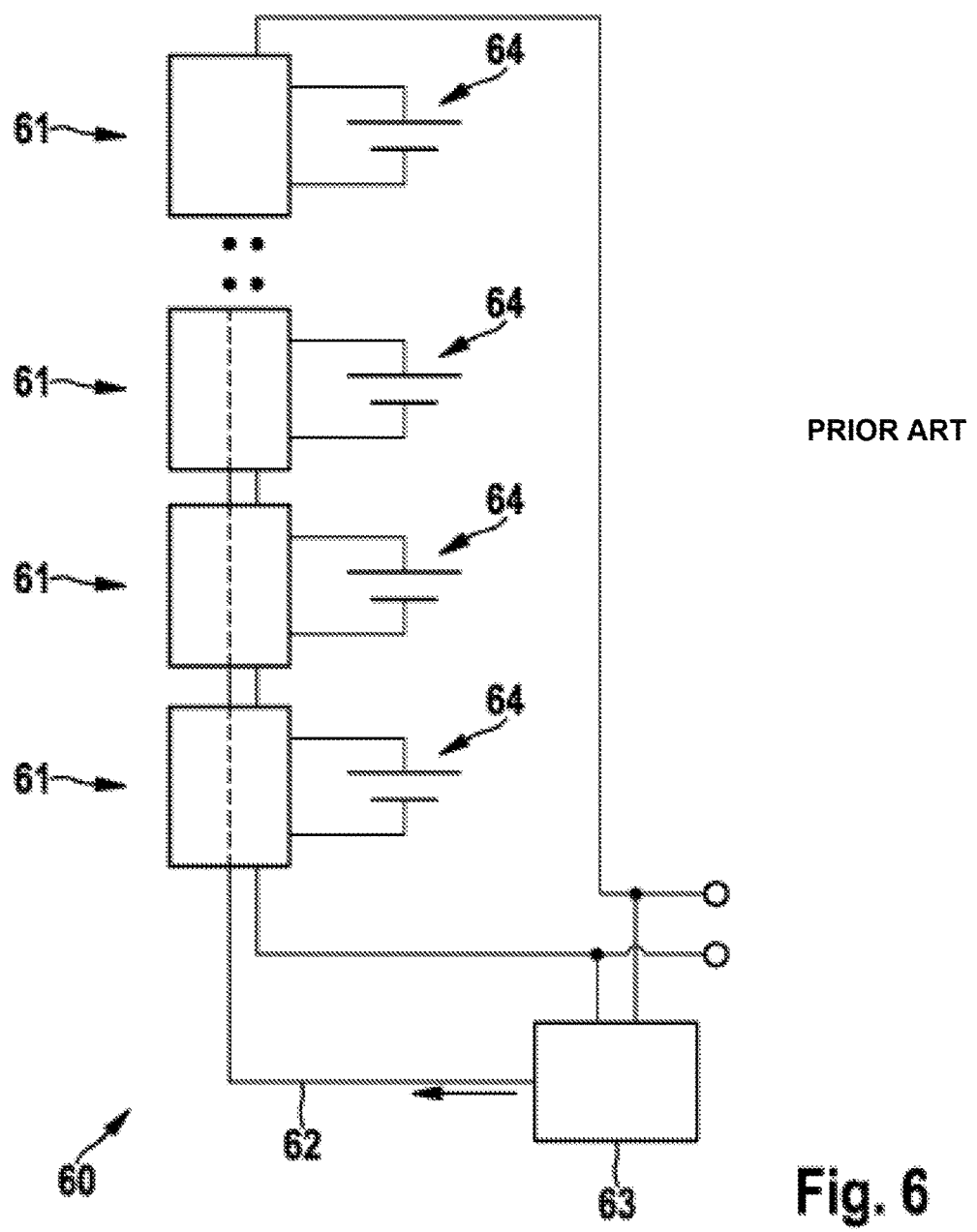
FIG. 6 shows a schematic depiction of a battery according to the prior art comprising a plurality of battery cell control units.

If a suitable control voltage $U_{GS}$ is applied to the control input 53, the MOSFET 14 switches through and a current flow is thus made possible between the drain contact 11 and the source contact 12. It is ensured by means of the diode 15 that a current defined by the resistance R and the control voltage $U_{GB}$ does not flow off across the first or second terminal contact 51, 52. This state is depicted in a first time period 101 in the diagram from FIG. 5. In FIG. 5, the battery cell current $I_B$ is depicted by a dot-dashed line, a measurement voltage $U_{DS}$ by a solid line and the control voltage $U_{GS}$ by a dashed line. If a load is connected to the battery cell control unit 50, a battery cell current $I_B$ can flow from the first terminal contact 51 across the battery cell unit 20 and the discharging unit 10 to the second terminal contact 52. A measurement voltage $U_{DS}$ is measured between the drain contact 11 and the source contact 12 by the measurement unit 30. In this first embodiment, the measurement voltage $U_{DS}$ is "0" volts if the control voltage $U_{GS}$ is applied to the control input 53 because the electrical resistance between the drain contact 11 and the source contact 12 of the MOSFET 14 approaches "0".

In this second embodiment, the battery cell unit is switched off by the MOSFET 14 of the discharging unit 10 if the control voltage $U_{GS}$ is no longer applied to the control input 53. Simultaneously with the battery cell unit 20 being switched off, said battery cell unit is bypassed by closing the switching unit 54 in order to not interrupt a current flow through possible further battery cell units 20 that are connected in series to the battery cell unit 20. This state is depicted in a second time period 201 in the diagram from FIG. 5. The control voltage $U_{GS}$ is interrupted and drops. In this state, the MOSFET 14 switches off and the current flow between the drain contact 11 and the source contact 12 is interrupted. Due to the absent or at least high-impedance electrical connection between the drain contact 11 and the source contact 12, a measurement voltage $U_{DS}$ greater than "0" volts results. The measurement voltage $U_{DS}$ exceeds the no-load voltage of the battery cell unit 20 on account of the inductive behavior of said battery cell unit 20. As a result of the increased voltage level at the drain contact 11 of the MOSFET 14, a voltage between the drain contact 11 and the gate contact 13 exceeds the Zener voltage S of the Zener diode 16 disposed between these contacts in this state. The Zener diode 16 goes into breakdown, and a current can flow from the drain contact 11 to the gate contact 13 of the MOSFET 14. For that reason, a reduced control voltage $U_{DS}$, which is fed from the inductively stored energy from the battery cell unit 20, is applied to the MOSFET 14. The inductively stored energy from the battery cell unit 20 is therefore used to switch the MOSFET 14. The MOSFET is thereby operated in the linear working range thereof, and a resistive, electrically conductive connection is established between the drain contact 11 and the source contact 12. The energy stored inductively in the battery cell unit 20 is discharged via this electrically conductive connection and thus via the MOSFET 14 or respectively via the discharging unit 10 because the battery cell unit is short circuited via the switching unit 54 and the MOSFET 14. Because the inductively stored energy from the battery cell unit 20 decreases, the increased voltage level at the drain contact 13 of the MOSFET 14 likewise decreases. If the Zener voltage S of the Zener diode 16 is undershot, the control voltage $U_{GS}$ then drops to 0 volts, and the MOSFET 14 blocks the electrically conductive connection between the drain contact 11 and the source contact 13. The measurement voltage $U_{DS}$ drops to the value of a voltage of the battery cell unit 20 (respectively to a voltage of a battery, in the event a plurality of battery cell units is connected in series). The battery cell control unit 50 passes into the state which is depicted by the third time period 301 in FIG. 5. Hence, the inductively stored energy from the battery cell unit 20 is discharged by means of the discharging unit 10 after said battery cell unit 20 has been switched off, and the previously described first step S1 is therefore carried out.

The voltage $U_{DS}$—and thus also the increase in the measurement voltage $U_{DS}$ above the no-load voltage after the battery cell unit has been switched off and the drop in the measurement voltage $U_{DS}$ if the Zener voltage S is again undershot—is measured by the measuring unit. In so doing, the measuring unit 30 is equipped to determine the time period $t_M$ between this increase and drop in the measurement voltage $U_{DS}$. This determined time period $t_M$ is transmitted as an analog or digital value to the evaluation unit 40. The time period $t_M$ in which the inductively stored energy from the battery cell unit 20 has fallen to a predefined threshold value is thus determined by the measuring unit 30. In this second embodiment, the threshold value is defined by the Zener voltage S of the Zener diode 16. Hence, the previously described second step S2 is carried out by the measuring unit 30.

In this second embodiment, the determined time period $t_M$ is converted to a digital value and transmitted from the measuring unit 30 to the evaluation unit 40. In the evaluation unit 40, the determined time period $t_M$ is compared with a predefined table and thus the determined time period $t_M$ is converted to a value that describes the battery cell current $I_B$. Such a table can, for example, be predefined at the factory and be created in advance by means of a series of tests when simultaneously directly measuring the battery current $I_B$. An inductance of the battery cell unit 20 could likewise be determined and the battery cell current $I_B$ could be calculated by the evaluation unit 40. The evaluation unit 40 determines the battery cell current $I_B$ therefore on the basis of the determined time period $t_M$. Hence, the previously described third step S3 is carried out by the evaluation unit 40.

In general, it can be said that battery cell units 20 in a battery or a battery system are frequently switched on and off; thus enabling all of the cells to be uniformly loaded. During each switch-off process, the energy which is stored by means of the charging or respectively discharging current in the inductance of the cell has to be broken down. This can, for example, occur while using the avalanche operation of a MOSFET 14 or, with the aid of a Zener diode, during the linear operation of the MOSFET 11. In both variants, a source voltage of the MOSFET increases after switching off the battery cell current $I_B$ very quickly to the blocking voltage of the MOSFET or respectively the Zener voltage of the Zener diode until the energy has been dissipated and subsequently drops again to the level of the battery voltage. The time period $t_M$ in which the source contact 12 of the MOSFET 14 remains at the higher voltage level is proportional to the dissipated energy and thus proportional to the battery current $I_B$ that has previously flowed when the blocking voltage is the same and the inductance is the same. This time period $t_M$ can be easily measured by the microcontroller unit that is typically present in every battery cell control unit 50.

Each battery cell control unit 50 knows the time period with which it has been charged or discharged. By means of the method according to the invention, the battery cell control unit 50 likewise knows the associated battery cell current $I_B$. Thus, it is possible for the battery cell control unit 50 to calculate what energy the same has emitted. When considering the no-load voltage of the battery cell unit 20 in direct comparison to the energy already emitted, it is possible for the battery cell control unit 50 to determine the state of health (SOH) of the battery cell unit 20. The use of suitable algorithms can contribute to an already greatly aged battery cell unit 20 being treated with care. In this way, the maximum service life of the battery or the battery system is improved.

In addition to the disclosure stated above, reference is explicitly made to the disclosure of the FIGS. 1 to 6.

The invention claimed is:

1. A method for measuring a battery cell current ($I_B$) of a battery cell unit (20), the method comprising:
   discharging an inductively stored energy from the battery cell unit (2) by means of a discharging unit (10) after the battery cell unit (2) has been switched off, wherein the inductively stored energy from the battery cell unit (20) is an energy stored by means of an inductive behavior of the battery cell unit (20),
   determining a time period ($t_M$) in which the inductively stored energy from the battery cell (20) unit drops to a predefined threshold value, and
   determining a battery cell current ($I_B$) on the basis of the time period ($t_M$) determined.

2. A method according to claim 1, characterized in that the battery cell unit (20) is switched off by the discharging unit (10).

3. The method according to claim 1, characterized in that the inductively stored energy from the battery cell unit (20) is detected using a measurement voltage ($U_{DS}$) induced by the battery cell unit (20) after said battery cell unit (20) has been switched off.

4. The method according to claim 1, characterized in that the inductively stored energy from the battery cell unit (20) is discharged, the battery cell unit (20) is switched off via a transistor, or both.

5. The method according to claim 4, characterized in that the inductively stored energy from the battery cell unit (20) is discharged via a parasitic diode of a MOSFET (14), which goes into breakdown due to a voltage induced by the inductively stored energy from the battery cell unit (20).

6. The method according to claim 4, characterized in that the inductively stored energy from the battery cell unit (20) is used to switch the transistor in order to discharge the inductively stored energy from the battery cell unit (20) across the switched transistor.

7. The method according to claim 6, characterized in that the discharge of the inductively stored energy from the battery cell unit (20) is triggered by means of a diode, which goes into breakdown due to a voltage induced by the inductively stored energy from the battery cell unit (20) and thus provides a voltage for switching the transistor.

8. A device for measuring a battery cell current ($I_B$) of a battery cell unit (20), the device comprising:
   a discharging unit (10), which discharges an inductively stored energy from the battery cell unit (20) after said battery cell unit (20) has been switched off, wherein the inductively stored energy from said battery cell unit (20) is an energy stored by means of an inductive behavior of said battery cell unit (20),
   a measuring unit (30), which determines a time period ($t_M$) in which the inductively stored energy from the battery cell unit (20) has fallen to a predefined threshold value (S), and
   an evaluation unit (40), which determines a battery cell current ($I_B$) on the basis of the time period ($t_M$) determined.

9. A battery cell control unit (50) comprising:
   a battery cell unit (20),
   a discharging unit (10), which discharges an inductively stored energy from the battery cell unit (20) after said battery cell unit (20) has been switched off, wherein the inductively stored energy from said battery cell unit (20) is an energy stored by means of an inductive behavior of said battery cell unit (20),
   a measuring unit (30), which determines a time period ($t_M$) in which the inductively stored energy from the battery cell unit (20) has fallen to a predefined threshold value (S), and
   an evaluation unit (40), which determines a battery cell current ($I_B$) on the basis of the time period ($t_M$) determined.

10. A battery, characterized in that the battery comprises at least one battery cell control unit (40) according to claim 9.

\* \* \* \* \*